(12) United States Patent
Lee et al.

(10) Patent No.: US 8,742,593 B2
(45) Date of Patent: Jun. 3, 2014

(54) ELECTRICAL CONNECTION FOR MULTICHIP MODULES

(75) Inventors: Seok-Chan Lee, Seoul (KR); Min-Woo Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/530,971

(22) Filed: Jun. 22, 2012

(65) Prior Publication Data

US 2012/0319290 A1 Dec. 20, 2012

Related U.S. Application Data

(62) Division of application No. 12/968,592, filed on Dec. 15, 2010, now Pat. No. 8,217,519, which is a division of application No. 12/032,430, filed on Feb. 15, 2008, now Pat. No. 7,888,806.

(30) Foreign Application Priority Data

Jul. 23, 2007 (KR) .............................. 2007-0073476

(51) Int. Cl.
*H01L 23/48* (2006.01)
(52) U.S. Cl.
USPC .... 257/774; 257/777; 257/786; 257/E25.013; 257/E25.027
(58) Field of Classification Search
USPC ........... 257/777, 774, 786, E25.013, E25.027
See application file for complete search history.

(56) References Cited

U.S. PATENT DOCUMENTS

| | | | |
|---|---|---|---|
| 5,364,009 A | 11/1994 | Takahashi et al. | |
| 5,870,289 A | 2/1999 | Tokuda et al. | |
| 6,459,156 B1 * | 10/2002 | Travis et al. | 257/774 |
| 6,869,870 B2 * | 3/2005 | Lin | 438/622 |
| 6,958,532 B1 | 10/2005 | Nakayama et al. | |
| 6,979,905 B2 | 12/2005 | Nishida et al. | |
| 7,105,930 B2 | 9/2006 | Lua et al. | |
| 7,298,033 B2 | 11/2007 | Yoo | |
| 7,453,159 B2 | 11/2008 | Song et al. | |
| 7,576,431 B2 | 8/2009 | Takahashi | |
| 7,585,750 B2 | 9/2009 | Do et al. | |
| 7,648,911 B2 | 1/2010 | Pagaila et al. | |
| 2002/0195697 A1 | 12/2002 | Mess et al. | |
| 2003/0022465 A1 | 1/2003 | Wachtler | |

(Continued)

FOREIGN PATENT DOCUMENTS

| | | |
|---|---|---|
| JP | 58222553 A | 12/1983 |
| JP | 2001-257307 | 9/2001 |

(Continued)

OTHER PUBLICATIONS

Office Action of May 14, 2013 in corresponding Japanese Application 2008-190314.

(Continued)

*Primary Examiner* — Andy Huynh
(74) *Attorney, Agent, or Firm* — Muir Patent Consulting, PLLC

(57) ABSTRACT

A semiconductor chip is provided. The semiconductor chip includes a semiconductor substrate, a circuit on the substrate, an insulating layer formed on the circuit, and a plurality of electrically floating conductor lines formed on the insulating layer, at a major surface of the semiconductor chip.

19 Claims, 16 Drawing Sheets

(56) References Cited

U.S. PATENT DOCUMENTS

| | | |
|---|---|---|
| 2004/0229398 A1 | 11/2004 | Magerlein et al. |
| 2005/0139985 A1 | 6/2005 | Takahashi |
| 2005/0200003 A1 | 9/2005 | Yoon et al. |
| 2006/0091560 A1 | 5/2006 | Kang et al. |
| 2006/0172465 A1 | 8/2006 | Brennan et al. |
| 2008/0272465 A1 | 11/2008 | Do et al. |

FOREIGN PATENT DOCUMENTS

| | | |
|---|---|---|
| JP | 2002-026239 | 1/2002 |
| JP | 2002-043503 | 2/2002 |
| JP | 2003-023135 | 1/2003 |
| JP | 2003-163239 | 6/2003 |
| JP | 2003-298001 | 10/2003 |
| JP | 2004-047715 A | 2/2004 |
| JP | 2007-067017 | 3/2007 |
| JP | 2007-103411 | 4/2007 |
| KR | 2000-0027519 A | 5/2000 |
| KR | 2001-0062929 A | 7/2001 |

OTHER PUBLICATIONS

Notice of Allowance including Search Report issued by the Taiwan Patent Office on Dec. 30, 2013 in related Patent Application No. 097126982.

* cited by examiner

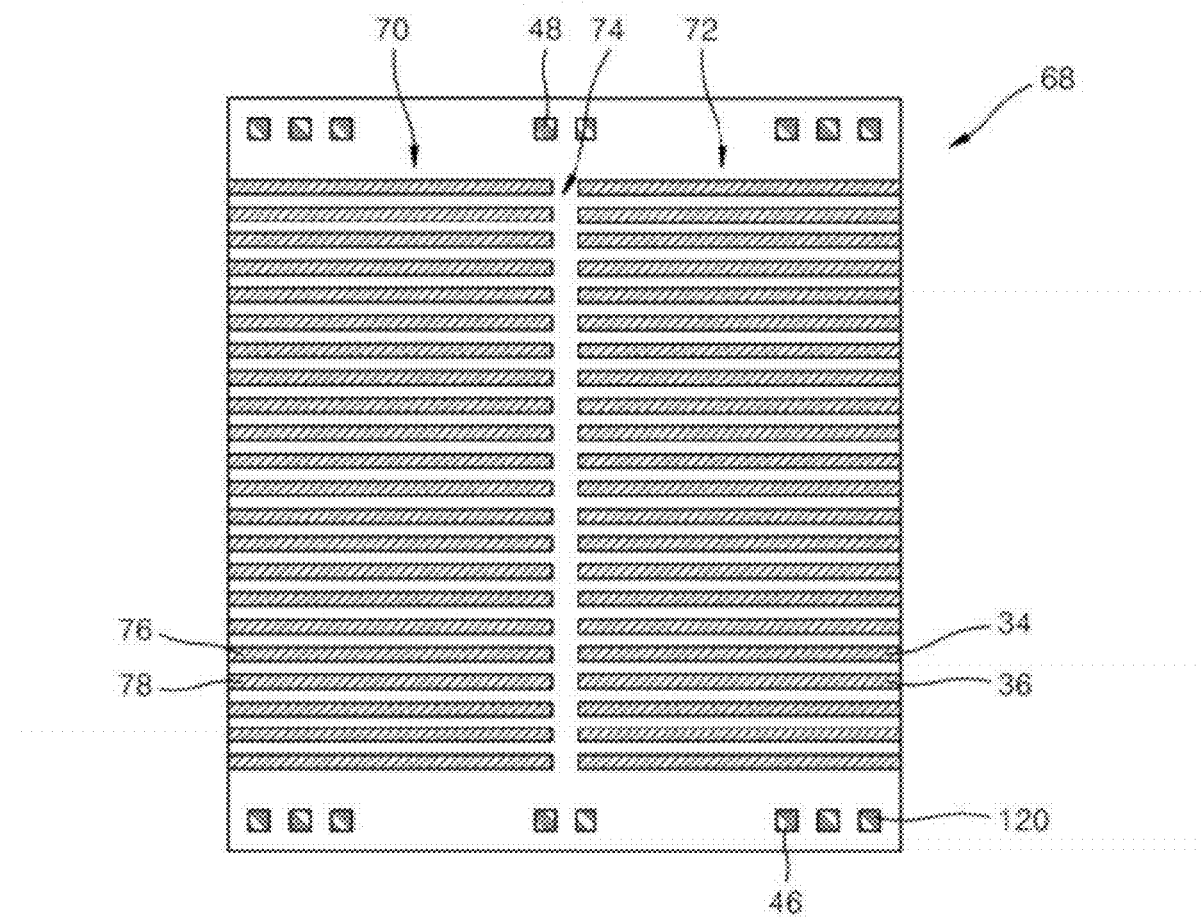
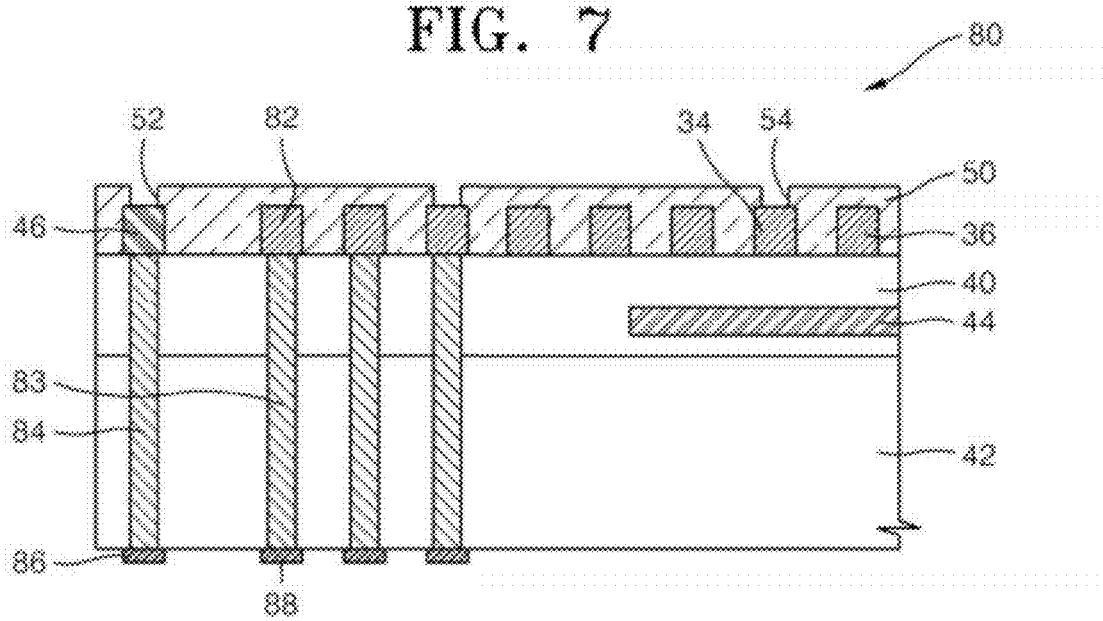

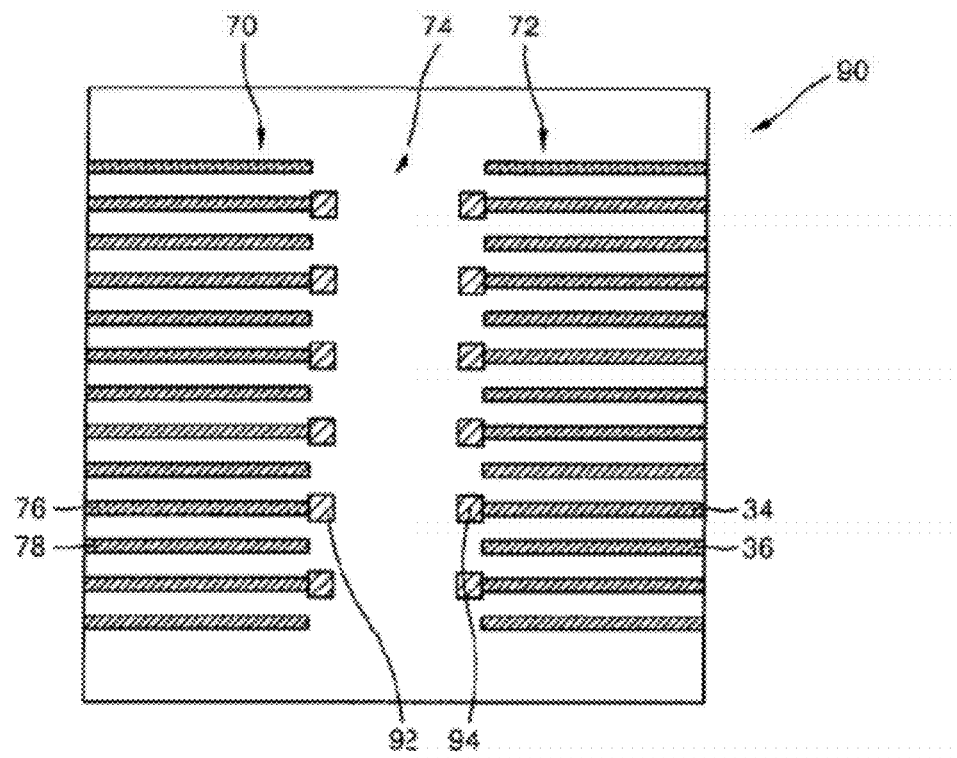

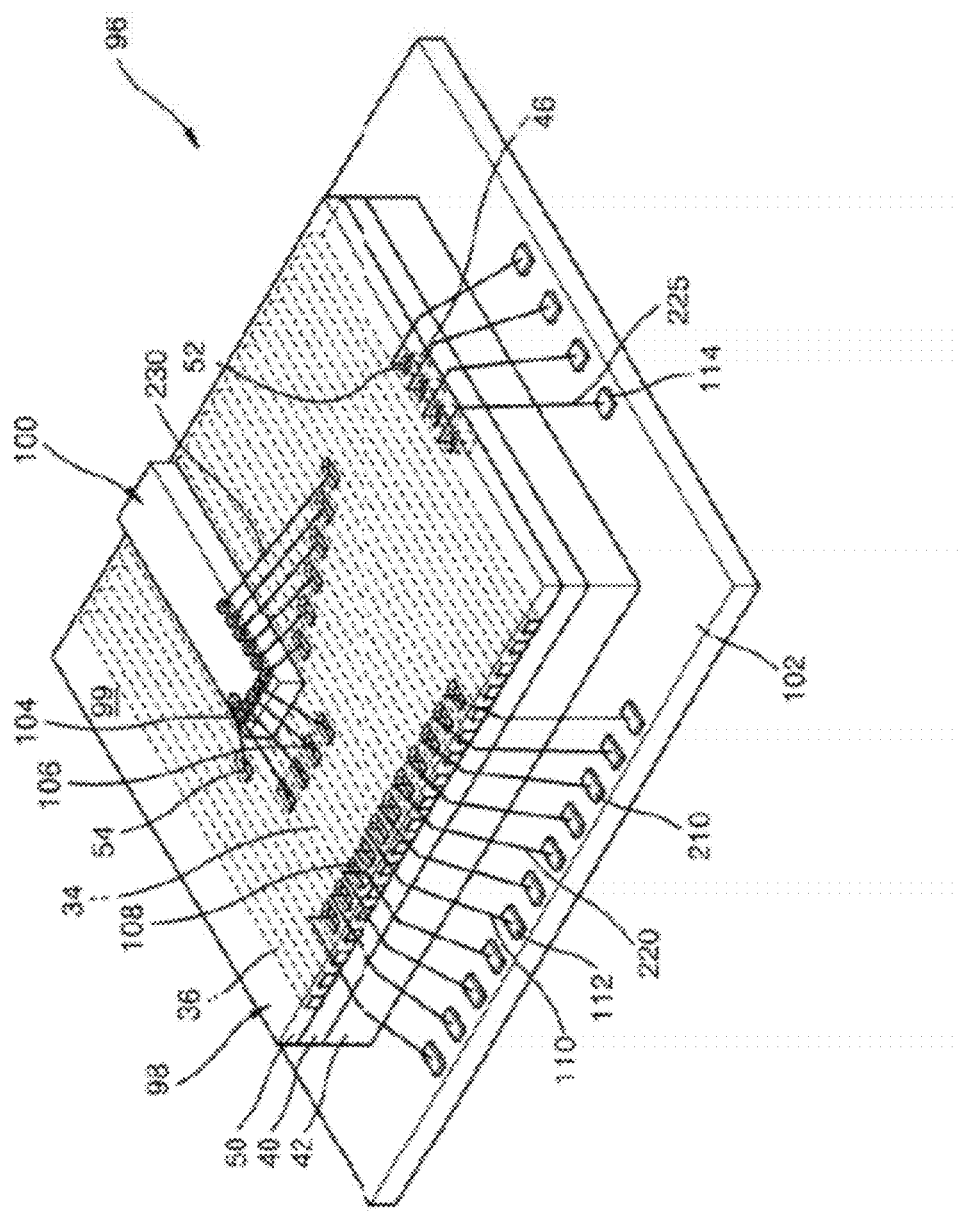

ELECTRICAL CONNECTION FOR MULTICHIP MODULES

CROSS-REFERENCE TO RELATED PATENT APPLICATION

This application is a Divisional of and claims the benefit of priority to U.S. patent application Ser. No. 12/968,592 filed on Dec. 15, 2010, now U.S. Pat. No. 8,217,519, which claims the benefit of priority and is a Divisional of U.S. patent application Ser. No. 12/032,430 filed on Feb. 15, 2008, now U.S. Pat. No. 7,888,806, which claims the priority of Korean Patent Application No. 2007-0073476, filed on Jul. 23, 2007, in the Korean Intellectual Property Office, the disclosure of each of which is incorporated herein in its entirety by reference.

BACKGROUND OF THE INVENTION

1. Field of the Invention

The present invention relates generally to multichip modules and more particularly to the manner in which electrical connections are made to the module or between chips in the module.

2. Description of the Related Art

As electronic products move to smaller size and higher density and performance, semiconductors have correspondingly become smaller with their components and connections becoming denser. This in turn has lead to the development of multichip package (MCPs) in which a plurality of semiconductor chips are stacked on a substrate such as a printed circuit board. This creates a high density, high performance package that is nonetheless small in size.

As density increases and size decreases, however, problems may develop with multichip modules. For example, in FIG. 1, an MCP includes a first semiconductor chip 10 mounted on a substrate 12. A second semiconductor chip 14 is mounted on semiconductor chip 10 thereby forming an MCP comprising semiconductor chips 10, 14. Chip 10, which is larger than chip 14, includes terminals such as terminals 16, 18. Chip 14 also includes terminals, like terminals 20, 22. As can be seen, the terminals on chip 14 are spaced much more closely together than those on chip 10. The terminals on both chips are electrically connected to conductive pads, like pads 24, 26, formed on substrate 12 via wire bonds, such as wire bonds 28, 30.

The terminals on chip 14, like terminals 20, 22, are further away and higher from substrate 12 than the terminals, like terminals 16, 18, on chip 10. As a result, the wire bonds connecting the terminals on chip 14 to substrate 12 are longer and form a greater angle relative to the substrate than the wire bonds that connect the terminals on chip 10 to the substrate pads. And the terminals on chip 14 are much closer together. All these factors may combine to produce wire sweeping, in which the wire bonds connecting the terminals on chip 14 to the substrate pads electrically short against one another. Also, the longer each wire bond, the more likely the wire will be broken during manufacturing, e.g., when the wires are encapsulated.

In addition to these problems, when the terminals are close together as on chip 14, there is a limit to how many adjacent terminals can be wire bonded to the substrate. As seen in FIG. 1, there is a gap indicated generally at 31 that must be included because the density and length of the bonds limit the number of adjacent wire bond connections.

It would be desirable to provide wire bonds or other electrical connections on the upper chip of an MCP that are shorter and have a smaller bonding angle relative to the substrate. One approach uses a redistribution network, but it cannot be employed in some types of chips because the chip design must include certain electrical characteristics, and this complicates chip design.

Another approach uses an interposer, but this increases fabrication cost and does not completely resolve the problems associated with long wires, terminals at a high elevation relative to the substrate, and large bonding angles.

BRIEF DESCRIPTION OF THE DRAWINGS

FIG. 6 is a top plan view of a fourth embodiment of the present invention.

FIG. 7 is a fifth embodiment of the present invention depicted in a view similar to FIGS. 3 and 4.

FIG. 8 is a top plan view of a sixth embodiment of the present invention.

FIG. 9 is a perspective, somewhat schematic view of a first MCP constructed in accordance with the present invention.

DETAILED DESCRIPTION OF THE EMBODIMENTS

Turning again to the drawings, FIGS. 2-8 illustrate a variety of semiconductor chips that may be placed on top of another chip in an MCP. FIGS. 9-18 illustrate semiconductor chips, including chips like those depicted in FIGS. 2-8, in MCPs.

Figure 1:
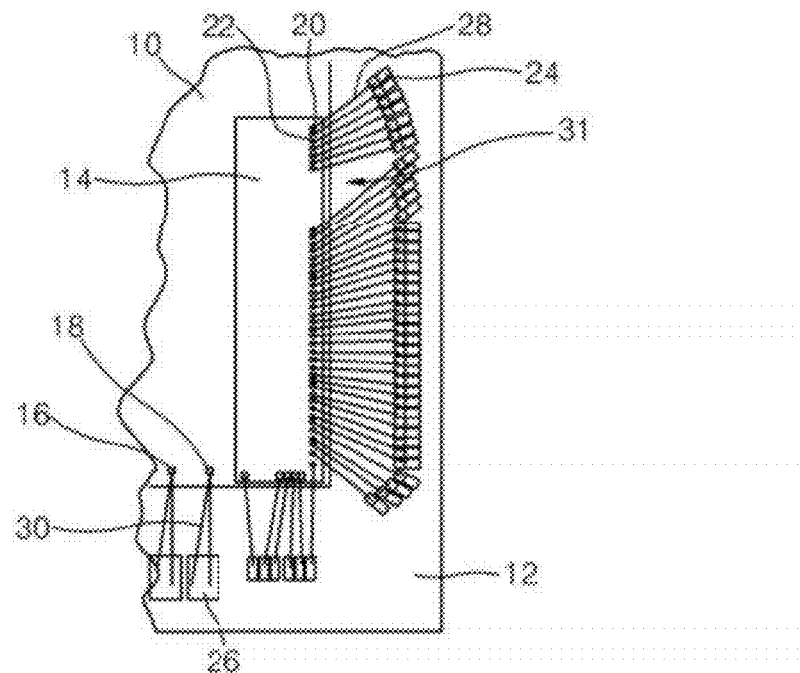
FIG. 1 is an enlarged partial view of a prior art MCP.
Figure 2:
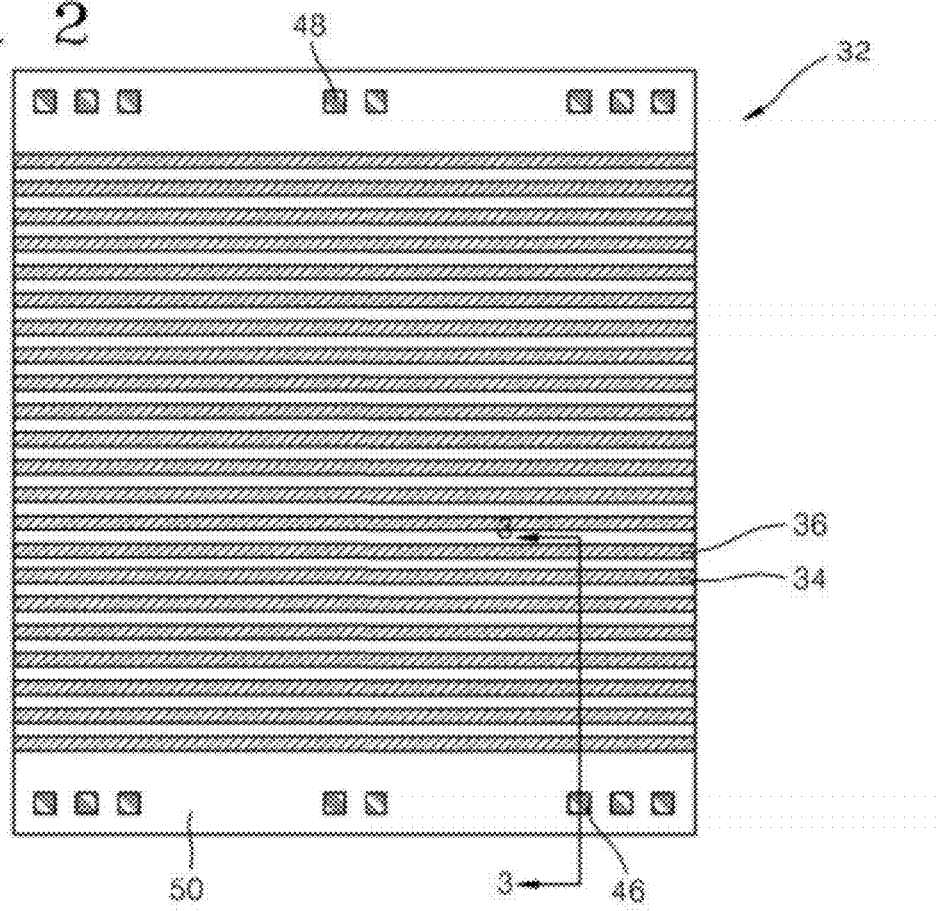
FIG. 2 is a top plan view of a semiconductor chip constructed in accordance with the present invention.
Figure 3:
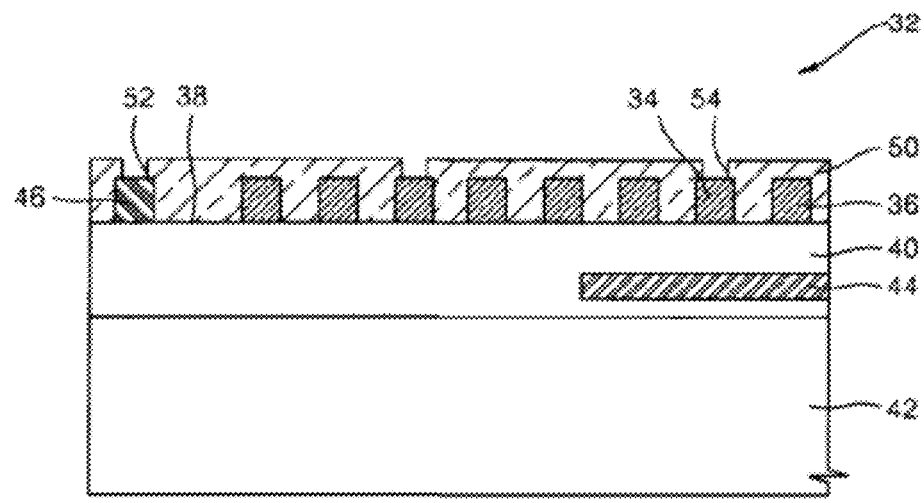
FIG. 3 is an enlarged cross sectional view taken along line 3-3 in FIG. 2.

With reference first to FIGS. 2 and 3, indicated generally at 32 is a semiconductor device. Device 32 includes a plurality of conductive lines, like conductive lines 34, 36. The conductive lines are formed on the surface 38 of a dielectric layer 40, which in turn is formed on a semiconductor substrate 42. The conductive lines can form a pattern of alternating lines and spaces, as shown. An internal circuit region 44 is formed in dielectric layer 40. Conductive chip pads, like pads 46, 48, are formed on dielectric layer 40 and connect to internal circuit portions (not depicted) of semiconductor device 32. A passivation layer 50 is formed on dielectric layer 40.

Openings, like openings 52, 54, are formed in passivation layer 50 with opening 52 exposing a portion of chip pad 46 and opening 54 exposing a portion of conductive line 34. Each of the chip pads, like chip pads 46, 48, include a corresponding opening to expose the chip pads for connection to external circuitry. Additional openings, like opening 54, are formed over at least some of the metal lines in a manner that will be described more fully herein.

The chip pads, like chip pads 46, 48, may be formed in the same process step, or in a different step, as formation of the conductive lines, like lines 34, 36. The conductive lines are electrically isolated from the chip pads. Conductive lines that provide power or ground connections in an MCP may be wider than other conductive lines.

Figure 4:
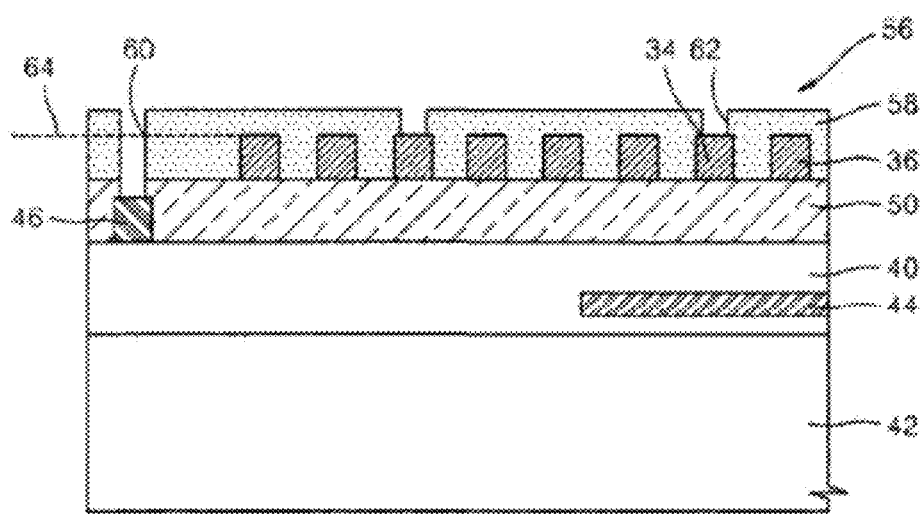
FIG. 4 is a second embodiment of the present invention depicted in a view similar to FIG. 3.

In FIG. 4, indicated generally at 56 is another semiconductor chip according to the invention. Structure that corresponds to previously identified structure is either unnumbered or carries the same identifying number. In chip 56, the conductive lines, like conductive lines 34, 36, are formed on top of passivation layer 50 rather than on top of dielectric layer 40 as in FIG. 3. A resin layer 58 is formed on top of passivation layer 50 and includes openings, like openings 60, 62, to expose the chip pads and parts of the conductive lines in the same manner as openings 52, 54 in FIG. 3. Resin layer 58 comprises a polymer layer including polyimide.

In chip 56, the chip pads and conductive lines can be formed in different planes and in different process steps. To increase wire bonding efficiency and to prevent difficulties during wire bonding caused by the difference in height between the chip pads and the conductive lines, the height of the chip pads, like chip pad 46, may be extended in a further process step to the level of dashed line 64 thereby bringing the upper surfaces of both the conductive lines and the chip pads to substantially the same plane.

The extension of the chip pads, like chip pad 46, to the level of dashed line 64 may be accomplished in the same process step in which the conductive lines are formed thereby bringing the upper surfaces of both the conductive lines and the chip pads to substantially the same plane. For example, after the formation of the opening 52 as shown in FIG. 3, a blanket conductive layer (not shown) can be formed on passivation layer 50 and chip pad 46. The conductive lines and an extended portion (not shown) of chip pad 46 can be formed by a conventional patterning process of the blanket conductive layer. The resin layer 58 is formed on top of passivation layer 50 and includes the openings, like opening 62 and upper portion of opening 60, to expose the extended portion of the chip pads and parts of the conductive lines in the same manner as openings 52, 54 in FIG. 3.

Figure 5:
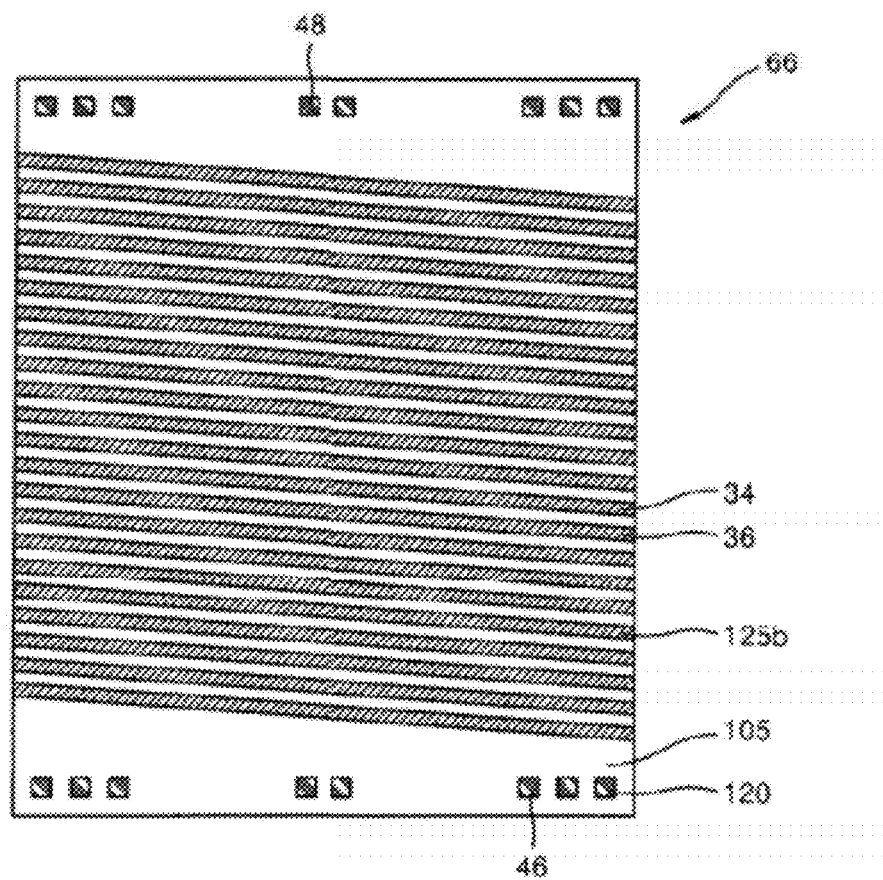
FIG. 5 is a top plan view of a third embodiment of the present invention.

In FIG. 5, indicated generally at 66 is another semiconductor chip according to the invention. Structure that corresponds to previously identified structure is either unnumbered or carries the same identifying number. In chip 66, the conductive lines, like conductive lines 34, 36, are at an angle relative to the generally rectangular shape of chip 66. Lines 34, 36 may be placed at any angle, and may not even necessarily be linear—for example, one or more lines could be curved—so long as the lines are electrically isolated from the chip pads, like pads 46, 48.

In FIG. 6, indicated generally at 68 is another semiconductor chip according to the invention. Structure that corresponds to previously identified structure is either unnumbered or carries the same identifying number. In chip 68, the conductive lines, like conductive lines 34, 36, are separated into two groups 70, 72, with the groups being separated by a space indicated generally at 74. As a result, lines 34, 36 are electrically isolated from collinear lines 76, 78, respectively. As will be seen, this permits lines in each group, like lines 34, 36, to propagate different signals because they are electrically isolated from one another.

In FIG. 7, indicated generally at 80 is another semiconductor chip according to the invention. Structure that corresponds to previously identified structure is either unnumbered or carries the same identifying number. In chip 80, at least one of conductive lines, like 82, and chip pad 46 are each connected to a conductive through-silicon via (TSV) 83, 84, respectively, as are several other of the conductive lines and chip pads, although the chip pad connections are not visible in FIG. 7. Each conductive TSV is connected to a conductive pad, like pads 86, 88.

The TSVs are each formed through dielectric layer 40 and semiconductor substrate 42 and thereby carry signals from the metal lines and chip pads to the conductive pads, like pads 86, 88, on the underside of semiconductor chip 80. As will be seen, this arrangement facilitates connections in an MCP. This approach could also be used in the embodiment of FIG. 4.

In FIG. 8, indicated generally at 90 is another semiconductor chip according to the invention. Structure that corresponds to previously identified structure is either unnumbered or carries the same identifying number. Semiconductor chip 90 has conductive lines laid out in a manner similar to semiconductor chip 68 in FIG. 6. Chip 90, however, includes center chip pads, like chip pads 92, 94. As the chip pads in the other embodiments do, the chip pads in chip 90 make electrical connections with circuitry internal to chip 90. Unlike the other embodiments, however, each of the chip pads on chip 90 are electrically connected to a single corresponding conductive line, like chip pads 92, 94 are connected to lines 76, 34, respectively. As can be seen, there are additional conductive lines that are not connected to chip pads. These additional unconnected lines are electrically isolated from the internal chip circuitry and from the chip pads. This arrangement provides for redistribution of the signals on the chip pads via the conductive line to which each pad is connected, as will be further described in connection with FIG. 18.

Indicated generally at 96 in FIG. 9 is an MCP. The MCP includes a first semiconductor chip 98 and a second semiconductor chip 100. Structure that corresponds to previously identified structure is either unnumbered or carries the same identifying number. Chip 98 is constructed similarly to chip 32 in FIGS. 2 and 3. Chip 100 is mounted on chip 98 via adhesive, and chip 98 is mounted on a substrate 102, also using adhesive. A first side (not visible) of chip 98 is mounted on substrate 102. Chip 100 is mounted on the second side 99 of chip 98.

Chip 100 includes conductive pads as shown that are connected via wire bonds, like wire bond 104, to conductive line 34. A portion of conductive line 34 is exposed by an opening 106 etched into passivation layer 50 in the manner shown in FIG. 3. This permits wire bond 104 to be electrically connected to the conductive line by a bonding process. As a result, internal circuitry of chip 100 is electrically connected to conductive line 34 via a chip pad on chip 100 and wire bond 104. This redistributes the connection point for the internal circuitry of chip 100.

Another opening 108 over conductive line 34 provides access to the conductive line for bonding one end of another wire 110 to conductive line 34. The other end of wire 110 is bonded to a terminal 112 on substrate 102. Other terminals on chip 100 are bonded to other conductive lines via wire bonds, like wire bond 104, as shown, and these other conductive lines are in turn bonded to terminals, like terminal 112 on substrate 102, via wire bonds like wire bond 110. In this manner, the connections to circuitry in chip 100 are redistributed to facilitate wire bonding in a manner that obviates problems associated with the length, height, and bonding angles of the conventional approach. Chip pads, or terminals, on first semiconductor chip 98 are connected to terminals, like terminal 114 on substrate 102, via wire bonds like wire bond 225. The terminals such as terminal 114 are also referred to herein as electrical contacts.

This approach provides for electrically connecting chip 100 and substrate 102 with wire bonds that have a length, height, and bonding angle similar to the wire bonds that connect the pads on chip 98 to the substrate.

Figure 10:
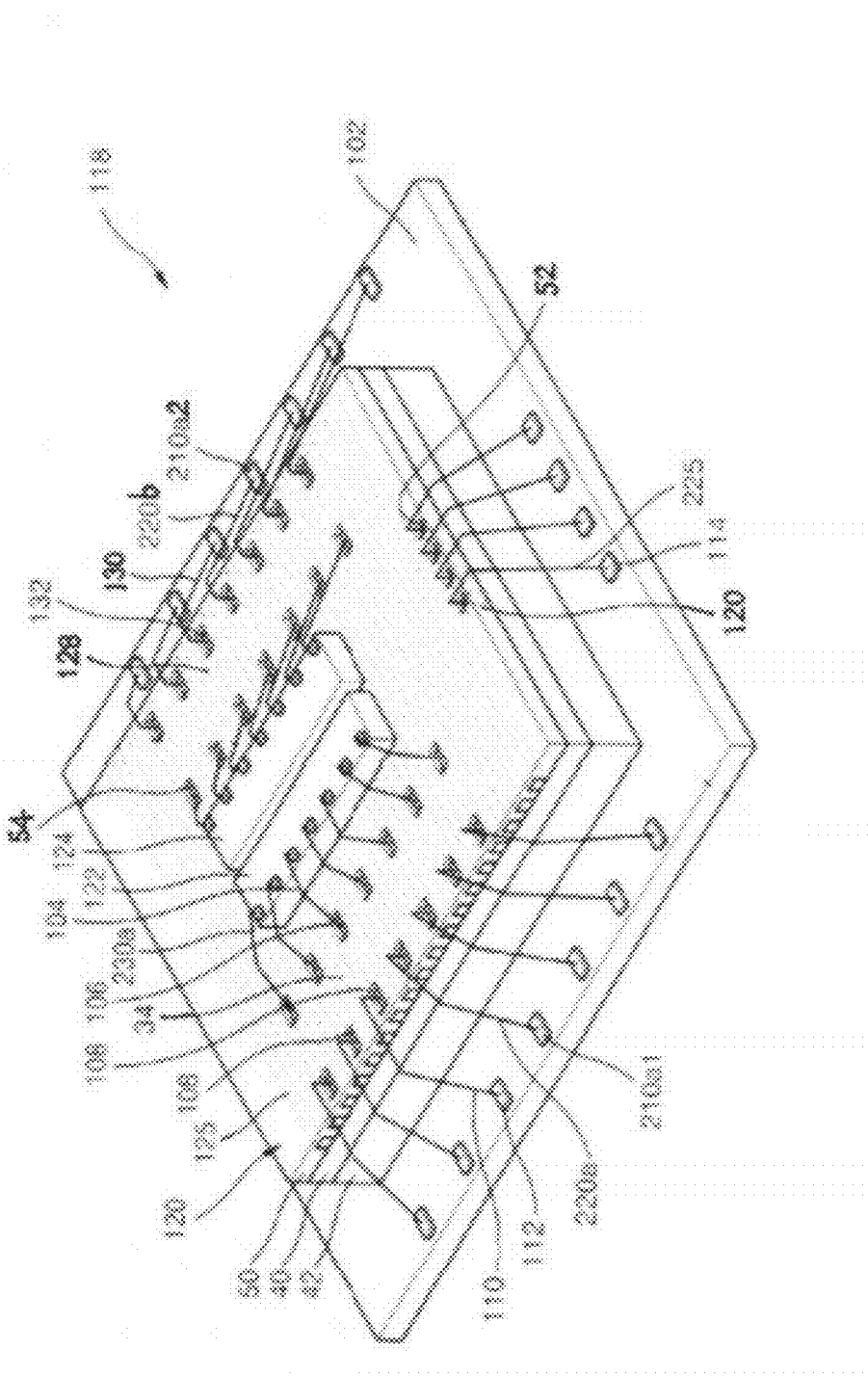
FIG. 10 is a perspective, somewhat schematic view of a second MCP constructed in accordance with the present invention.

Indicated generally at 118 in FIG. 10 is an MCP. The MCP includes a first semiconductor chip 120, a second semiconductor chip 122, and a third semiconductor chip 124. Structure that corresponds to previously identified structure is either unnumbered or carries the same identifying number. Chip 120 is constructed similarly to chip 98 in FIG. 9. And chips 122, 124 are mounted on chip 120 similarly to the way chip 100 is mounted on chip 98 in FIG. 9.

Chip 124 includes pads that are connected to metal lines in a manner similar to how the pads on chip 122 are connected to metal lines. For example, on chip 122 a wire bond 104 connects one of the pads on chip 122 to a conductive line 128. Another wire bond 130 is connected to conductive line 128 through an etched opening 132. The other end of wire bond 130 is connected to one of the terminals on substrate 102.

Because each conductive line is isolated from every other conductive line, and from internal semiconductor circuitry, adjacent conductive lines, like lines 34, 128, may be used to route connections from the pads on chips 122, 124, respectively. In MCP 118, every other conductive line is associated with connections from one of chips 122, 124. In other words, if the conductive lines are consecutively numbered, the odd ones are connected to pads on one of the chips and the even ones are connected to pads on the other chip.

Figure 11:
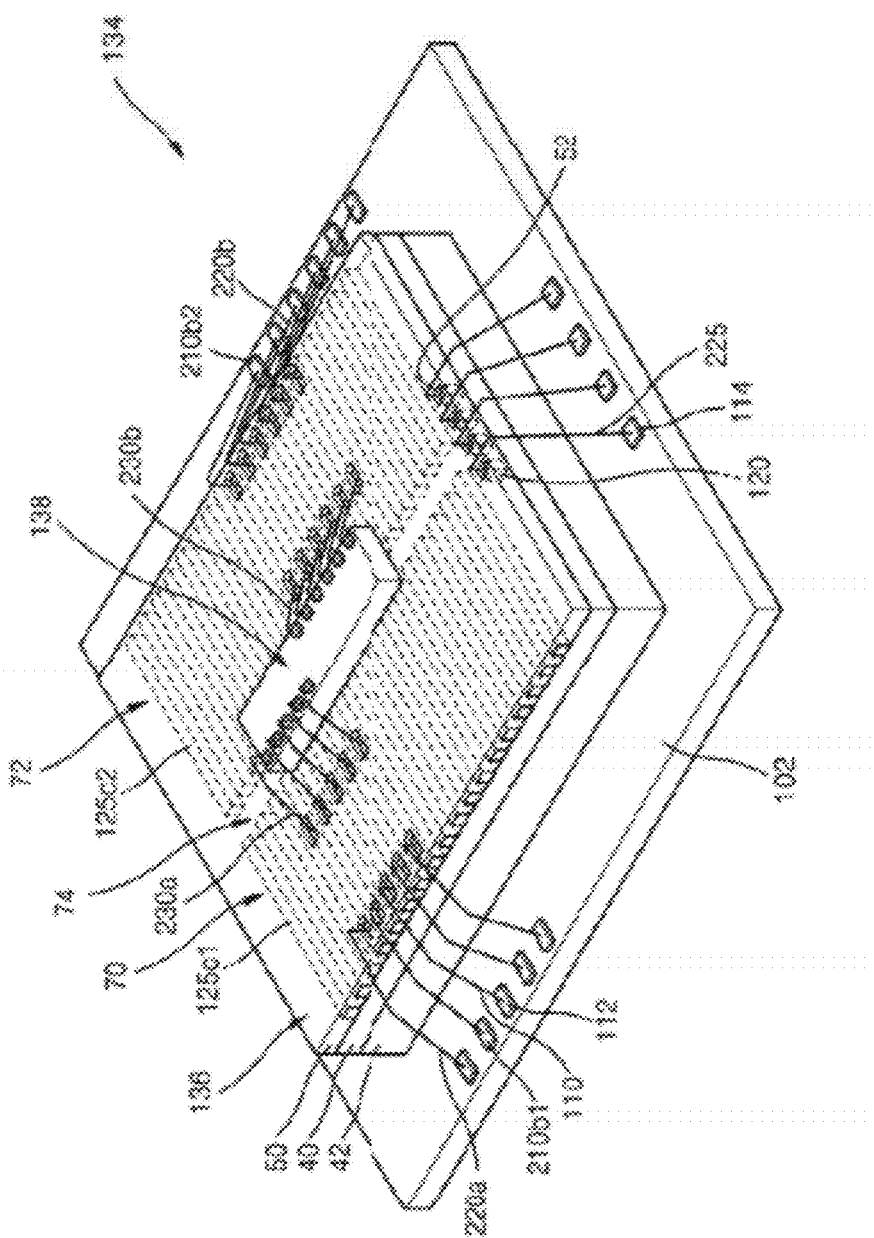
FIG. 11 is a perspective, somewhat schematic view of a third MCP constructed in accordance with the present invention.

Indicated generally at 134 in FIG. 11 is an MCP. The MCP includes a first semiconductor chip 136 and a second semiconductor chip 138. Structure that corresponds to previously identified structure is either unnumbered or carries the same identifying number. Chip 136 is constructed similarly to chip 68 in FIG. 6. And chip 138 is mounted on chip 136 similarly to the way chip 100 is mounted on chip 98 in FIG. 9.

As can be seen, pads on one side of chip 138 are connected via wire bonds as previously described to adjacent lines in line group 70, and the pads on the other side are connected via wire bonds to adjacent lines in line group 72. Each of the lines to which a pad on chip 138 is connected is in turn connected via another wire bond to a terminal on substrate 102. As a result, the pitch of the pads or, the number of pads along the edges of the second chip, may be increased because at least two sides of chip 136 may be used as signal paths via the metal line groups 70, 72.

Figure 12:
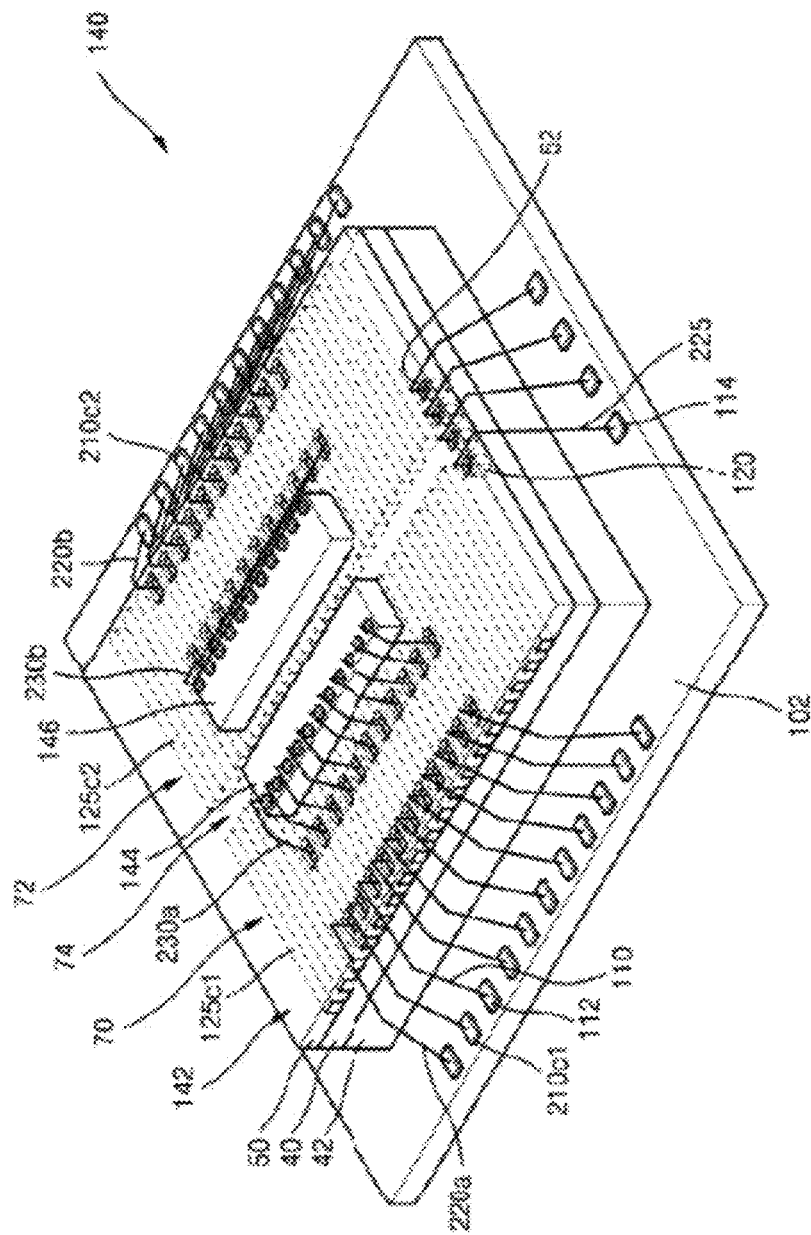
FIG. 12 is a perspective, somewhat schematic view of a fourth MCP constructed in accordance with the present invention.

Indicated generally at 140 in FIG. 12 is an MCP. The MCP includes a first semiconductor chip 142, a second semiconductor chip 144, and a third semiconductor chip 146. Structure that corresponds to previously identified structure is either unnumbered or carries the same identifying number. Chip 142 is constructed similarly to chip 136 in FIG. 11. And chips 144 and 146 are mounted on chip 142 similarly to the way previously described chips are mounted on the first semiconductor chip.

In MCP 140 the pads on chip 144 are connected via wire bonds to conductive lines in group 70 in the manner previously described, and the pads on chip 146 are connected to the conductive lines in group 72. The two groups of conductive lines are in turn connected via wire bonds to terminals on substrate 102, also as previously described. This approach provides for a high density MCP.

Figure 13:
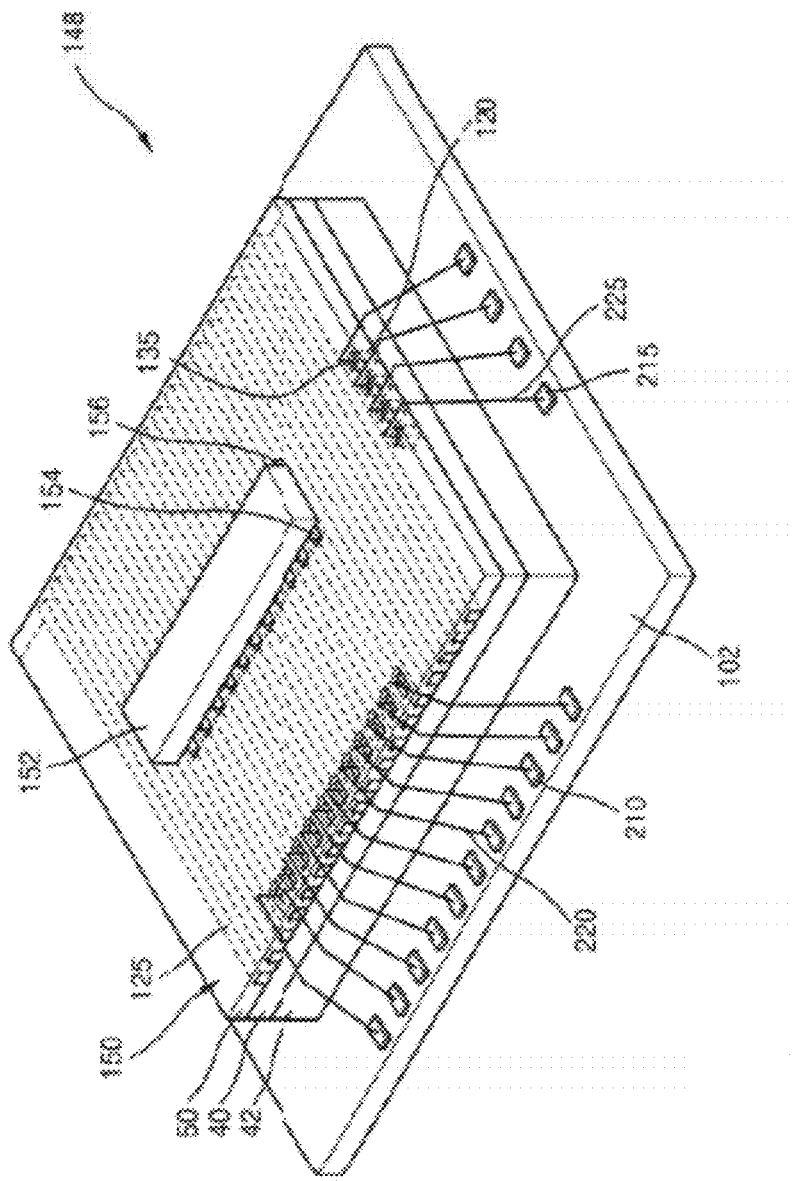
FIG. 13 is a perspective, somewhat schematic view of a fifth MCP constructed in accordance with the present invention.
Figure 14:
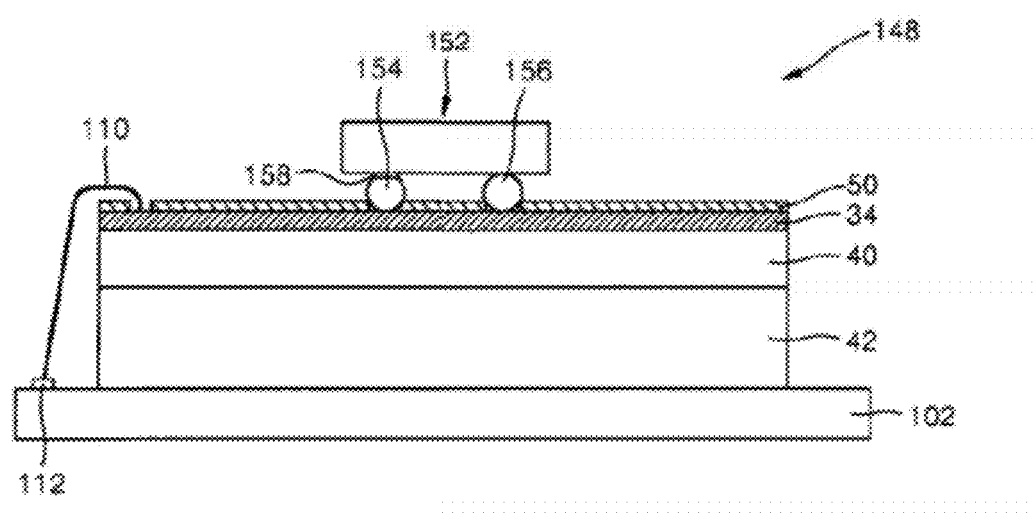
FIG. 14 is a cross sectional view of the fifth embodiment of the present invention.

Indicated generally at 148 in FIG. 13 is an MCP. The MCP includes a first semiconductor chip 150 and a second semiconductor chip 152. Structure that corresponds to previously identified structure is either unnumbered or carries the same identifying number. Chip 150 is constructed similarly to chip 98 in FIG. 9. Chip 152 is mounted on chip 150 using solder bumps 154, 156, best seen in FIG. 14. Solder bump 154 is mounted on a chip pad 158 that is connected to internal circuitry of chip 152. But bump 156 provides only structural support for chip 152; it is not connected to any internal chip circuitry. Both bumps 154, 156 are supported on metal line 34, which carries whatever voltage appears on pad 158. The pitch of the bumps on chip 152 is substantially the same as the pitch of the conductive lines, like conductive line 34, on chip 150. This approach facilitates use of flip chip bonding with the bumps being formed on chip 152. As a result, there are no wire bonds connected to the second chip, thus eliminating disadvantages associated with use of wire bonds.

In an alternative approach (not shown) conducting bump 154 may be received completely within the opening in the passivation layer over conductive line 34 with the underside of chip 152 being supported on passivation layer 50. This may require a thicker passivation layer than depicted in FIG. 14, but eliminates the need for a support bump, like bump 156, because the chip is resting on and supported by passivation layer 50.

In another alternative approach, the first semiconductor chip 150 can be mounted on the substrate 102 with its active surface, which includes chip pads, facing substrate 102. In that structure, an insulating layer (not shown) can be formed on the surface opposite the active surface of the first semiconductor chip 150, namely the exposed surface of the semiconductor substrate 42. The conductive lines can be formed on the insulating layer (not shown). The first semiconductor chip 150 can be coupled to substrate 102 by flip chip bonding and the conductive lines can be used to form electrical connections between the second semiconductor chip 152 and the substrate 102. The second semiconductor chip may be connected to the conductive lines in any manner described herein.

Figure 15:
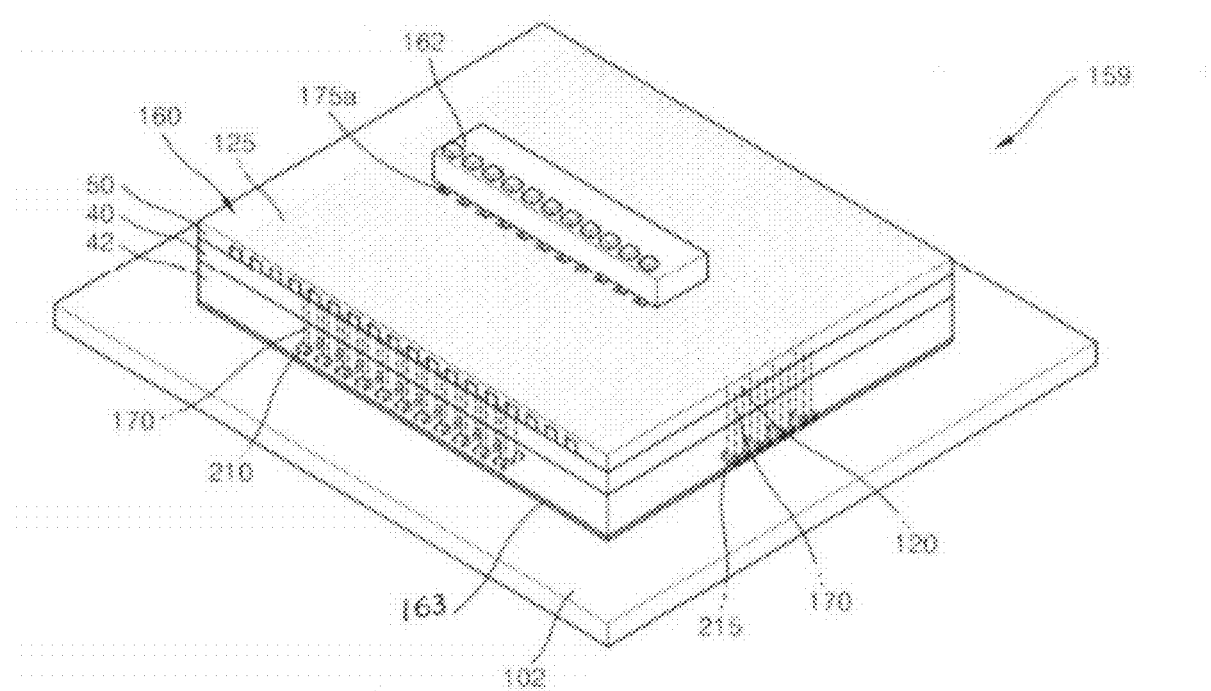
FIG. 15 is a perspective, somewhat schematic view of a sixth MCP constructed in accordance with the present invention.
Figure 16:
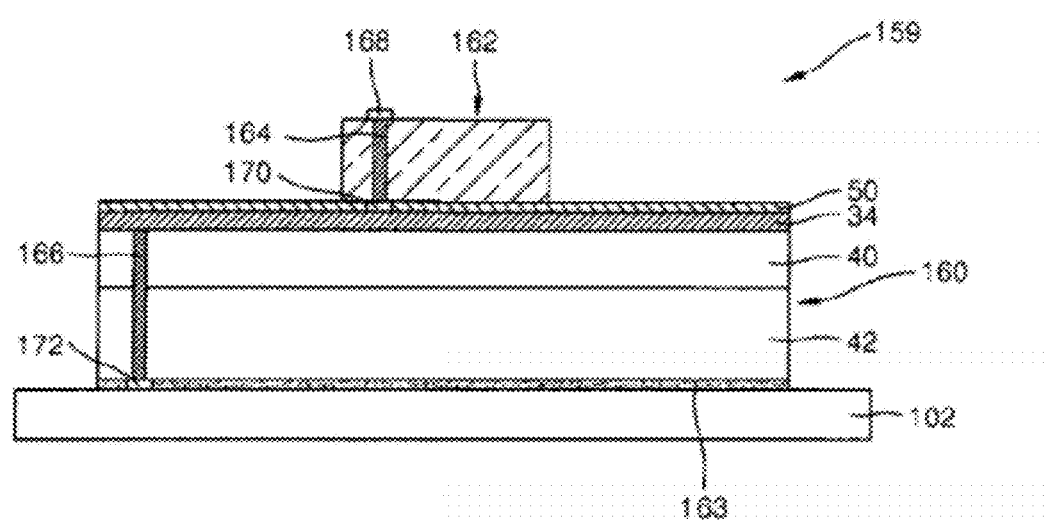
FIG. 16 is a cross sectional view of the sixth embodiment of the present invention.

Indicated generally at 159 in FIGS. 15 and 16 is an MCP. The MCP includes a first semiconductor chip 160 mounted on the substrate 102 with an adhesive layer 163 and a second semiconductor chip 162. Structure that corresponds to previously identified structure is either unnumbered or carries the same identifying number. Both chips are constructed similarly to chip 80 in FIG. 7 in that each has conductive TSVs, like TSV 166 in chip 160 and TSV 164 in chip 162.

One end of TSV 164 is connected to a conductive pad 168 formed on chip 162. Pad 168 is connected to internal circuitry of chip 162. The other end of TSV 164 is connected to a redistributed pad 170, which is in turn mounted on conductive line 34. Alternatively, TSV 164 may be directly connected to conductive line 34 without the need for redistributed pad 170.

The upper end of a TSV 166 (in chip 160) is connected to the underside of conductive line 34 with the lower end being connected to a terminal 172 formed on substrate 102. As a result, an internal circuit connection in chip 162 is redistributed via pad 168, TSV 164, conductive line 34, and TSV 166 to terminal 172 on substrate 102. This approach obviates the need for any wire bonding. In other words, it provides an MCP without any wire bonds. The first semiconductor chip 160 is secured to substrate 102 with an adhesive layer 163.

Figure 17:
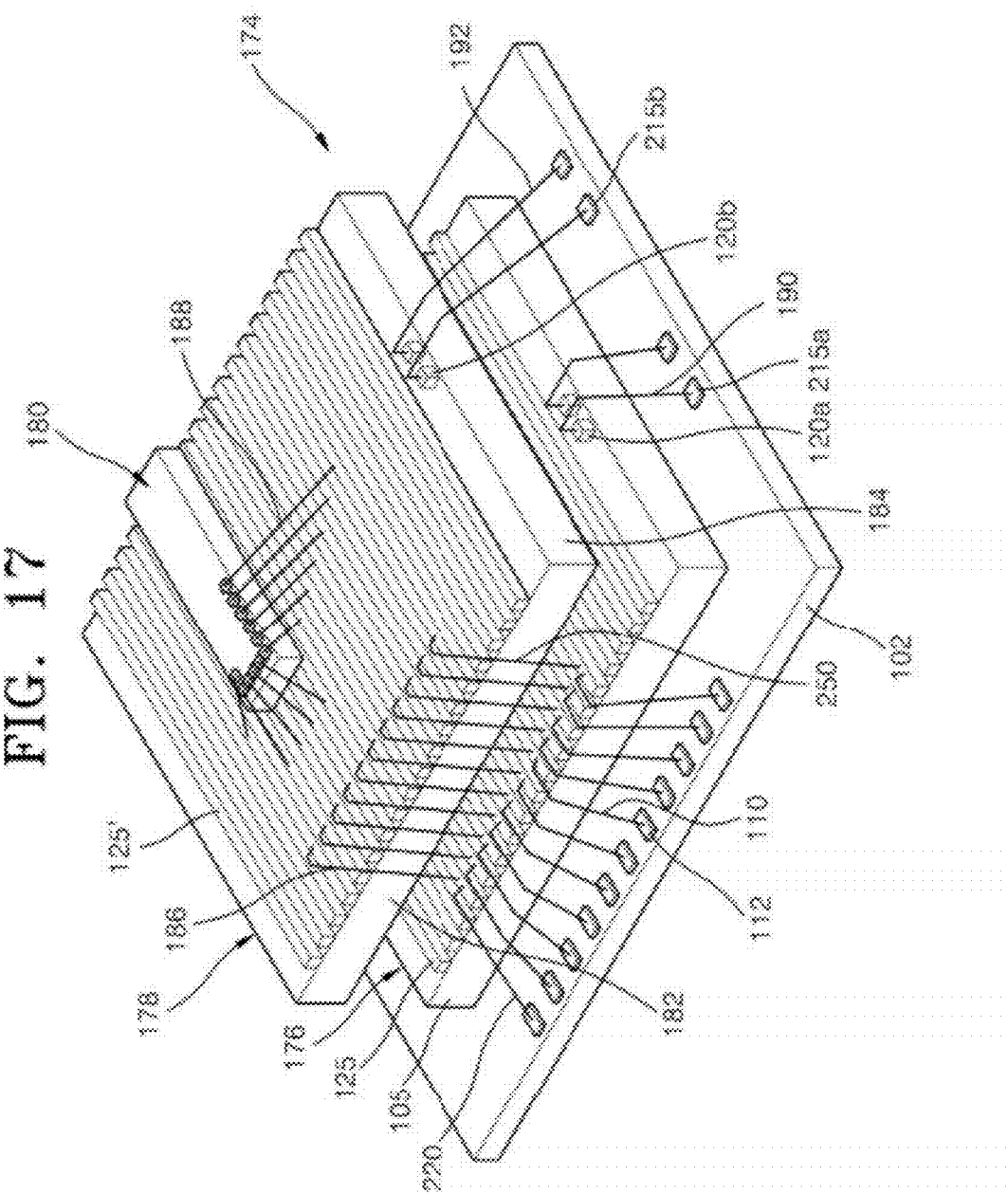
FIG. 17 is a perspective, somewhat schematic view of a seventh MCP constructed in accordance with the present invention.

Indicated generally at 174 in FIG. 17 is an MCP. The MCP includes a first semiconductor chip 176, a second semiconductor chip 178, and a third semiconductor chip 180. Structure that corresponds to previously identified structure is either unnumbered or carries the same identifying number. Chips 176, 178 are constructed similarly to chip 98 in FIG. 9. Chips 176, 178 are substantially identical to one another and may comprise, e.g., memory chips. As can be seen, chip 178 is mounted on chip 176 with the centers of both chips offset from one another. This results in two sides of chip 178 lapping over two edges of chip 176 with substantial portions of the other two sides 182, 184 of chip 178 being set back from the other two edges of chip 176. As a result, wire bond connections, like wire bond 110, may be made between the conductive lines on chip 176 and the terminals on substrate 102, like terminal 112, and further wire bond connections, like wire bond 186, may be made between the conductive lines on chip 178 and the conductive lines on chip 176. It is of course possible to stack chips of different sizes with the larger chip preferably being beneath a smaller chip.

Chip 180, which may be, e.g., an LSI circuit such as a processor, is mounted on chip 178 using adhesive. The pads on chip 180 are connected to conductive lines on chip 178 using wire bonds, like wire bond 188. As a result, circuitry internal to chip 180 may be connected via wire bonds, like wire bond 188, to the conductive lines on chip 178. These conductive lines are connected via wire bonds, like wire bond 186, to conductive lines on chip 176, which are in turn connected via wire bonds, like wire bond 110, to terminals, like terminal 112 on substrate 102.

The terminals on chips 176, 178 are connected via wire bonds, like wire bonds 190, 192, respectively, to terminals on substrate 102. In an alternative embodiment (not shown) TSVs, like those shown in FIGS. 7, 15, and 16, may be used to provide some or even all of the connections shown as wire bonds in FIG. 17.

Figure 18:
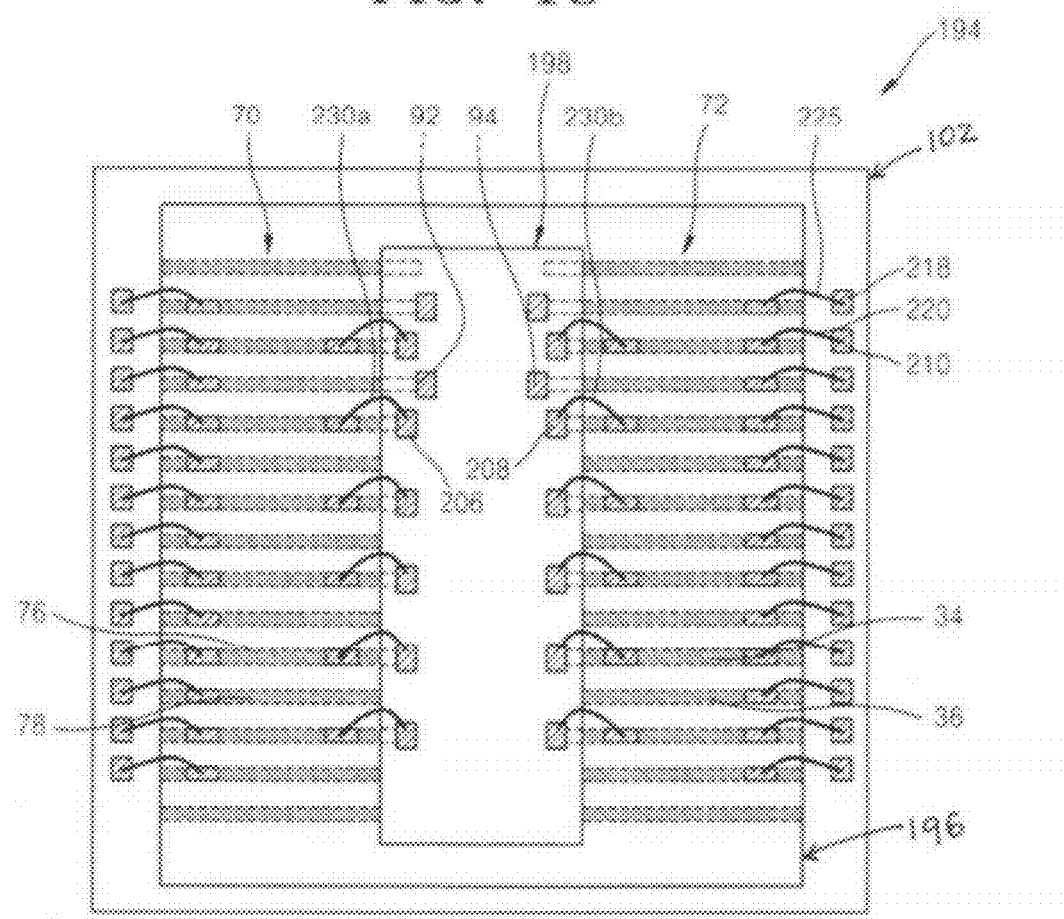
FIG. 18 is a top, plan, somewhat schematic view of a eighth MCP constructed in accordance with the present invention.

Indicated generally at 194 in FIG. 18 is an MCP. The MCP includes a first semiconductor chip 196 and a second semiconductor chip 198. Structure that corresponds to previously identified structure is either unnumbered or carries the same identifying number. Chip 196 is constructed similarly to chip 90 in FIG. 8. Chip 196 includes a plurality of conductive chip pads, like pads 92, 94 disposed on an upper surface of chip 196 beneath chip 198. These pads on chip 196 are disposed in two substantially parallel rows beneath chip 198 with pad 92 being in one row and pad 94 in the other.

Every other conductive line in each of groups 70, 72 is connected to one of the pads, like pads 92, 94. Every other conductive line in each of groups 70, 72 is connected to a conductive pad, like pads 206, 208, on the upper surface of chip 198 via wire bonds, like wire bonds, 230*a*, 230*b*, respectively. Put differently, every even conductive line is connected to pads, like pads 92, 94, on the upper surface of chip 196, and every odd conductive line is connected to pads, like pads 206, 208, on the upper surface of chip 198, with the latter connections being made with wire bonds, like wire bonds 230*a*, 230*b*.

Further wire bonds, like wire bonds 225, 220, connect the conductive lines to terminals, like terminals 218, 210, respectively, on substrate 102. In an alternative embodiment (not shown), a chip smaller than chip 198 is mounted on chip 196 between the two rows of pads on chip 196. In other words, the second chip does not cover the pads on the first chip.

Figure 19:
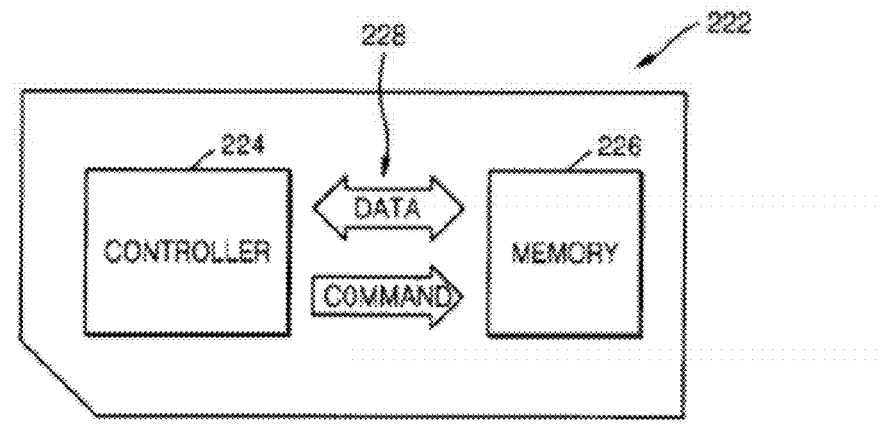
FIG. 19 is a schematic diagram of a card constructed in accordance with the present invention.

Turning now to FIG. 19, indicated generally at 222 is a schematic diagram of a card constructed in accordance with the present invention. Card 222 may be, e.g., a multimedia card (MMC) or a secure digital card (SD). Card 222 includes a controller 224 and a memory 226, which could be a flash, PRAM, or another type of non-volatile memory. A communication channel, indicated generally at 228, permits the controller to provide commands to the memory and to transfer data into and out of memory 226. Controller 224 and memory 226 may comprise an MCP in accordance with any of the previously described embodiments. The card 222 can have a larger density than conventional type. In the present invention, it is possible to remove interposer chips, so that card thickness can be reduced with respect to the conventional card having interposer chips. Additionally, the present invention can reduce defects from card caused by wire broken, so that reliability of card can be increased.

Figure 20:
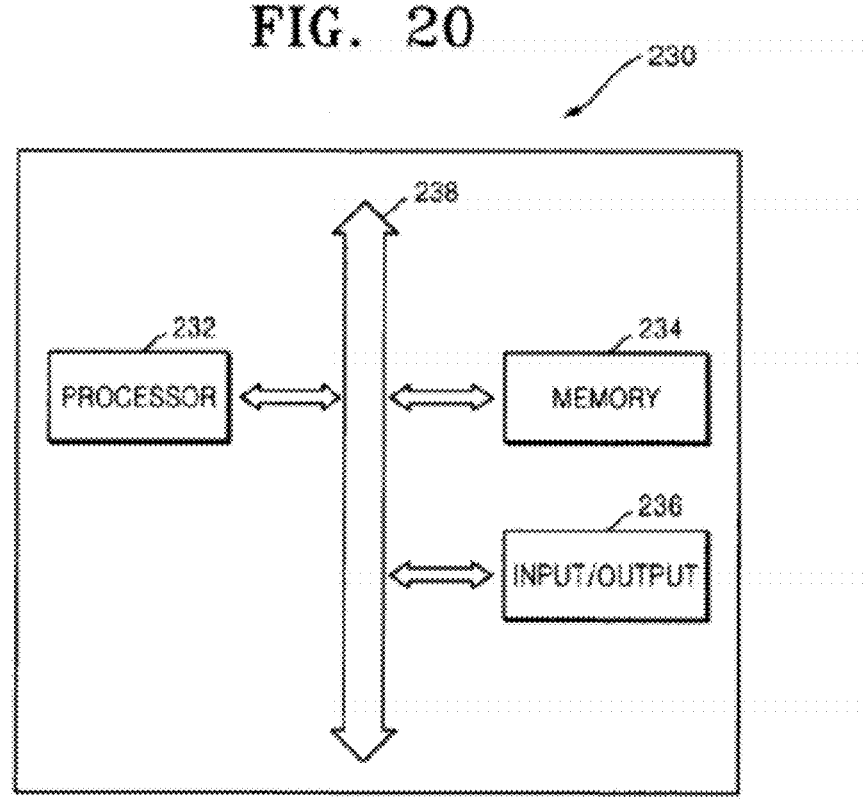
FIG. 20 is a schematic diagram of a system constructed in accordance with the present invention.

Considering now FIG. 20, indicated generally at 230 is a system constructed in accordance with the present invention. System 230 may be, e.g., a computer system, a mobile phone, an MP3 player, a GPS navigation device, a solid state disk (SSD), a household appliance, etc. System 230 includes a processor 232; a memory 234, which could be a DRAM, flash, PRAM, or another type of memory; and an Input/Output Device 236. A communication channel 238 permits the processor to provide commands to the memory to transfer data into and out of memory 234 via channel 238. Data and commands may be transferred to and from system 230 via Input/Output device 236. Processor 232 and memory 234 may comprise an MCP in accordance with any of the previously described embodiments. The present invention can make the stable system because the present invention can reduce defects caused by a broken wire.

What is claimed is:

1. A semiconductor chip comprising:
   a semiconductor substrate;
   a circuit on the substrate;
   an insulating layer formed on the circuit;
   a passivation layer formed on the insulating layer;
   a plurality of electrically floating conductor lines formed on the passivation layer, at a major surface of the semiconductor chip, each of the plurality of electrically floating conductor lines forming a corresponding electrical node that is not electrically connected to any other electrical circuitry of the semiconductor chip; and
   a resin layer disposed on the plurality of conductor lines, wherein openings are formed in the resin layer.

2. The semiconductor chip of claim 1, wherein the plurality of conductor lines are linear.

3. The semiconductor chip of claim 2, wherein the plurality of conductor lines are patterned across a majority of the major surface of the semiconductor chip.

4. The semiconductor chip of claim 1, wherein the plurality of conductor lines are parallel to each other and are spaced apart at a first pitch.

5. The semiconductor chip of claim 1, wherein the plurality of conductor lines extend between one edge to a center portion of the major surface.

6. The semiconductor chip of claim 5, wherein the plurality of conductor lines extend between one edge to an opposite edge of the major surface.

7. The semiconductor chip of claim 1, further comprising:
chip pads configured to connect the circuit on the substrate to external circuitry, and
wherein the plurality of conductor lines are formed of a conductive layer above the chip pads.

8. The semiconductor chip of claim 1, further comprising:
chip pads configured to connect the circuit on the substrate to external circuitry,
wherein the openings include a first opening in the resin layer exposing with respect to the resin layer one of the chip pads.

9. The semiconductor chip of claim 8, wherein the openings include a second opening exposing with respect to the resin layer one of the conductor lines.

10. The semiconductor chip of claim 1, wherein the resin layer is in contact with the plurality of conductor lines.

11. The semiconductor chip of claim 10, wherein the plurality of conductor lines are in contact with the passivation layer.

12. The semiconductor chip of claim 11, wherein the resin layer is in contact with the passivation layer at locations between adjacent ones of the plurality of conductor lines.

13. The semiconductor chip of claim 10, wherein the plurality of conductor lines are patterned across a majority of the major surface of the semiconductor chip.

14. The semiconductor chip of claim 10, wherein the plurality of conductor lines extend between one edge to a center portion of the major surface.

15. The semiconductor chip of claim 10, wherein the plurality of conductor lines extend between one edge to an opposite edge of the major surface.

16. A semiconductor chip comprising:
a semiconductor substrate;
a circuit on the substrate;
an insulating layer formed on the circuit;
a passivation layer formed on the insulating layer; and
a plurality of electrically floating conductor lines formed on the passivation layer, at a major surface of the semiconductor chip, each of the plurality of electrically floating conductor lines forming a corresponding electrical node that is not electrically connected to any other electrical circuitry of the semiconductor chip,
wherein the resin layer comprises portions at the same height as the plurality of conductor lines and disposed between the plurality of conductor lines.

17. The semiconductor chip of claim 16, wherein the plurality of conductor lines are patterned across a majority of the major surface of the semiconductor chip.

18. The semiconductor chip of claim 16, wherein the plurality of conductor lines extend between one edge to a center portion of the major surface.

19. The semiconductor chip of claim 18, wherein the plurality of conductor lines extend between one edge to an opposite edge of the major surface.

\* \* \* \* \*